United States Patent
Hsueh et al.

(10) Patent No.: US 8,074,153 B2
(45) Date of Patent: *Dec. 6, 2011

(54) ERROR CORRECTION DEVICES AND CORRECTION METHODS

(75) Inventors: Ching-Wen Hsueh, Luodong Township, Yilan County (TW); Li-Lien Lin, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/854,583

(22) Filed: Aug. 11, 2010

(65) Prior Publication Data

US 2010/0306623 A1    Dec. 2, 2010

Related U.S. Application Data

(63) Continuation-in-part of application No. 11/299,537, filed on Dec. 12, 2005, now Pat. No. 7,802,169.

(51) Int. Cl.
*H03M 13/00* (2006.01)
(52) U.S. Cl. ......... 714/784; 714/764; 714/754; 714/758
(58) Field of Classification Search .................. 714/784, 714/754, 758, 764
See application file for complete search history.

(56) References Cited

U.S. PATENT DOCUMENTS

| | | | |
|---|---|---|---|
| 4,593,395 A * | 6/1986 | Immink et al. | 714/755 |
| 6,065,146 A * | 5/2000 | Bosshart | 714/754 |
| 6,161,208 A | 12/2000 | Dutton et al. | |
| 6,434,081 B1 | 8/2002 | Johnson et al. | |
| 6,499,082 B1 | 12/2002 | Lin et al. | |
| 6,584,595 B2 | 6/2003 | Cypher | |
| 6,851,081 B2 | 2/2005 | Yamamoto | |
| 6,859,904 B2 | 2/2005 | Kocol et al. | |
| 7,509,558 B2 | 3/2009 | Muller et al. | |
| 2002/0191967 A1 | 12/2002 | Freissmann et al. | |
| 2004/0237023 A1* | 11/2004 | Takahashi et al. | 714/768 |
| 2005/0005230 A1* | 1/2005 | Koga et al. | 714/800 |

FOREIGN PATENT DOCUMENTS

| | | |
|---|---|---|
| CN | 1409856 | 4/2003 |
| WO | 0145101 | 6/2001 |
| WO | 2005006563 | 1/2005 |

* cited by examiner

*Primary Examiner* — Sam Rizk
(74) *Attorney, Agent, or Firm* — Thomas|Kayden

(57) ABSTRACT

An error correction device is provided. When an error of an incorrect data group stored in a memory is detected, a memory controller of the error correction device executes a burst read, burst write or burst read-modify-write (RMW) operations to the memory instead of the conventional single read-modify-write (RMW) operation, thereby reducing the occupied bandwidth of the memory.

21 Claims, 8 Drawing Sheets

ERROR CORRECTION DEVICES AND CORRECTION METHODS

This application is a Continuation-In-Part of pending U.S. patent application Ser. No. 11/299,537, filed Dec. 12, 2005 and entitled "ERROR CORRECTION DEVICES AND CORRECTION METHODS".

BACKGROUND

The invention relates to error correction devices, and in particular to methods for correcting errors by burst read and write, burst write or burst read-modify-write (RMW) operations.

When a data error stored in a dynamic random access memory (DRAM) device is detected, the data is corrected with a read-modify-write (RMW) operation. A conventional RMW operation is applied in such a manner that data is read out using an RMW function of the DRAM. The read data is then modified by an external circuit. The modified data is finally restored in the corresponding memory cell within the DRAM. The conventional RMW operation requires a relatively long processing time defined by the operating cycle of the DRAM, however resulting in inconvenience and performance degradation.

FIG. 1 shows a conventional scheme of an error correction device 1. The error correction device 1 comprises a decoder 10, a memory controller 11, and a dynamic random access memory (DRAM) 12. The DRAM stores a plurality of bytes of data. The error correction device 1 performs an RMW operation as each byte of data stored in the DRAM 12 is modified. The decoder 10 receives error correction codes (ECCs) and decodes a plurality of error values according to the ECCs. FIG. 2 depicts commands of the memory controller 11 in RMW operations, wherein the label "20" represents the commands of the memory controller 11, the label "21" represents reading/writing data on a DRAM bus, and the label "22" represents the error values. Referring FIGS. 1 and 2, one example of the correction of one byte of data D1 will be described. The memory controller 11 sends a pre-charge command (PRE) and an active command (ACT) to the DRAM 12, so that an address of the data D1 to be modified in the DRAM 12 is located. When the memory controller 11 then sends a read command (RD) to the DRAM 12, the DRAM 12 transmits the data D1 to a computing unit 13 in the memory controller 11 through the DRAM bus. The computing unit 13 also receives the error values from the decoder 10. The computing unit 13 performs a logic operation for the data D1 and the corresponding error value E1 to modify the data. When the memory controller 11 sends a write command (WR) to the DRAM 12, the modified data W1 is transmitted to the DRAM 12 from the computing unit 13 and restored in the corresponding address. Therefore, according to the conventional error correction device 1, the memory controller sends n pre-charge commands (PREs), n active commands (ACTs), n read commands, and n write commands for n bytes of data to be modified.

In FIG. 2, the memory controller sends no-operation commands (NOPs) between the pre-charge command (PRE) and the active command (ACT), between the active command (ACT) and the read command (RD), and between the read command (RD) and the write command (WR). These no-operation commands (NOPs) prevent unwanted commands during idle or wait states. The label "$P_{RMW}$" represent the duration of one RMW operation. The label "Trp20" represents the delay from the pre-charge command (PRE) to the active command (ACT), the label "Trcd20" represents the delay from the active command (ACT) to the read command (RD), the label "Trcl20" represents the delay from the read command (RD) to the time when the data D1 on the DRAM bus. Referring to FIG. 2, in one RMW operation, the error correction device 1 requires (Trp20+Trcd20+Tcl20+1(NOP 23)+1(WR)) cycles. "NOP23" is inserted to prevent DRAM Bus contention. It is assumed that each of the delays Trp20, Trcd20, and Trcl20 consumes 3 cycles, thus 11 cycles will be consumed when one byte of data is modified. A cluster of a blue-ray disc (BD) has 248*304 bytes, and it is assumed the error rate of a blue-ray disc is 5%. When the error correction device 1 is employed in a blue-ray disc, it will consume about 41459 cycles ((248*304*11*5%)=~41459). These cycle will degrade the DRAM bandwidth utilization. The following table shows the percentage of error correction cycles for different DISC speed. It is obvious that the percentage is higher when Disc speed is higher. As a result, it is very worthful to reduce the cycle consumed for error correction

| Blu-Ray DISC Speed | Cycles for 1 Cluster (Assume 1 cycle = 10 ns) | Percentage of Error correction |
|---|---|---|
| 1× | 956000 cycles | 41459/956000 = 4.33% |
| 4× | 239000 cycles | 41459/239000 = 17.35% |
| 8× | 119500 cycles | 41459/119500 = 34.69% |
| 14× | 68286 cycles | 41459/68286 = 60.71% |

SUMMARY

An exemplary embodiment of an error correction device comprises a memory controller and a computing unit. The error correction device is used to modify an incorrect data group among a plurality of data sets stored in a first memory. The memory controller executes a burst read operation to control the first memory to output the incorrect data group. The computing unit receives an error sequence and the incorrect data group and performs a logic operation for the error sequence and the incorrect data group to obtain a modified data group.

Another exemplary embodiment of an error correction device comprises a computing unit and a memory controller. The error correction device is used to modify an incorrect data group among a plurality of data sets stored in a first memory. The computing unit receives an error sequence and the incorrect data group and performs a logic operation for the error sequence and the incorrect data group to obtain a modified data group. The memory controller executes a burst write operation to control the first memory to receive the modified data group.

Another exemplary embodiment of an error correction device comprises a memory controller and a computing unit. The error correction device is used to modify n data sets stored in a memory. The memory controller executes a burst read-modify-write (RMW) operation to the memory for modifying the n data sets in n predetermined periods. When the memory controller executes the burst RMW operation to the memory, in the i-th predetermined period among the n predetermined periods, the computing unit receives the i-th data set and performs a logic operation for the i-th data set and an i-th error value to obtain the i-th modified data set. Then, the computing unit outputs the i-th modified data set to the memory, $1 \leq i \leq n$.

An exemplary embodiment of a method for modifying an incorrect data group among a plurality of data sets stored in a first memory is provided. The method comprises the steps of executing a burst read operation to the first memory to control the first memory to output the incorrect data group; and performing a logic operation for an error sequence and the incorrect data group to obtain a modified data group.

Another exemplary embodiment of a method for modifying an incorrect data group among a plurality of data sets stored in a first memory is provided. The method comprises the steps of performing a logic operation for an error sequence and the incorrect data group to obtain a modified data group; and executing a burst write operation to control the first memory to store the modified data group.

Another exemplary embodiment of a method for modifying n data sets stored in a memory is provided. The method comprises the step of executing a burst read-modify-write (RMW) operation to the memory to output the n data sets in n predetermined periods; and performing a logic operation for the i-th data set and an i-th error value to obtain the i-th modified data set and storing the i-th modified data set to the memory in the i-th predetermined period among the n predetermined periods, wherein $1 \leq i \leq n$.

DESCRIPTION OF THE DRAWINGS

The invention will become more fully understood from the detailed description given hereinbelow and the accompanying drawings, given by way of illustration only and thus not intended to be limitative of the invention.

DETAILED DESCRIPTION

Figure 1:
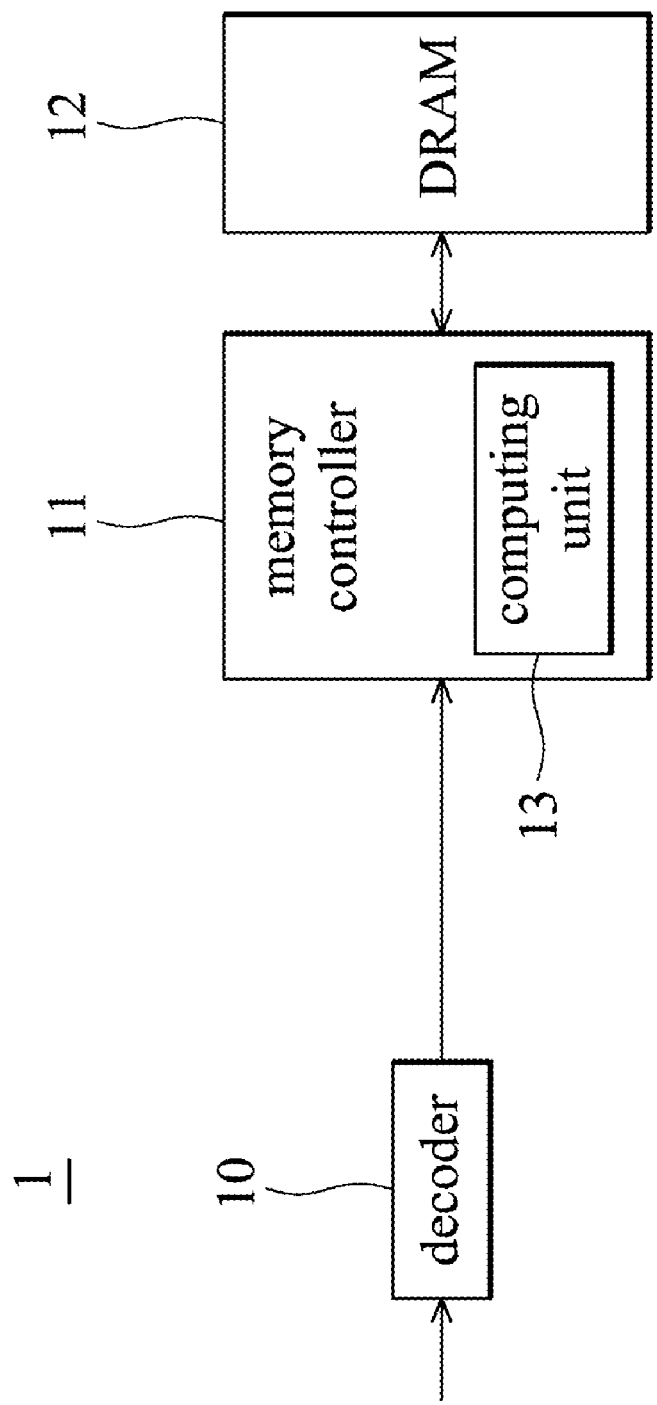
FIG. 1 shows a conventional scheme of an error correction device.
Figure 2:
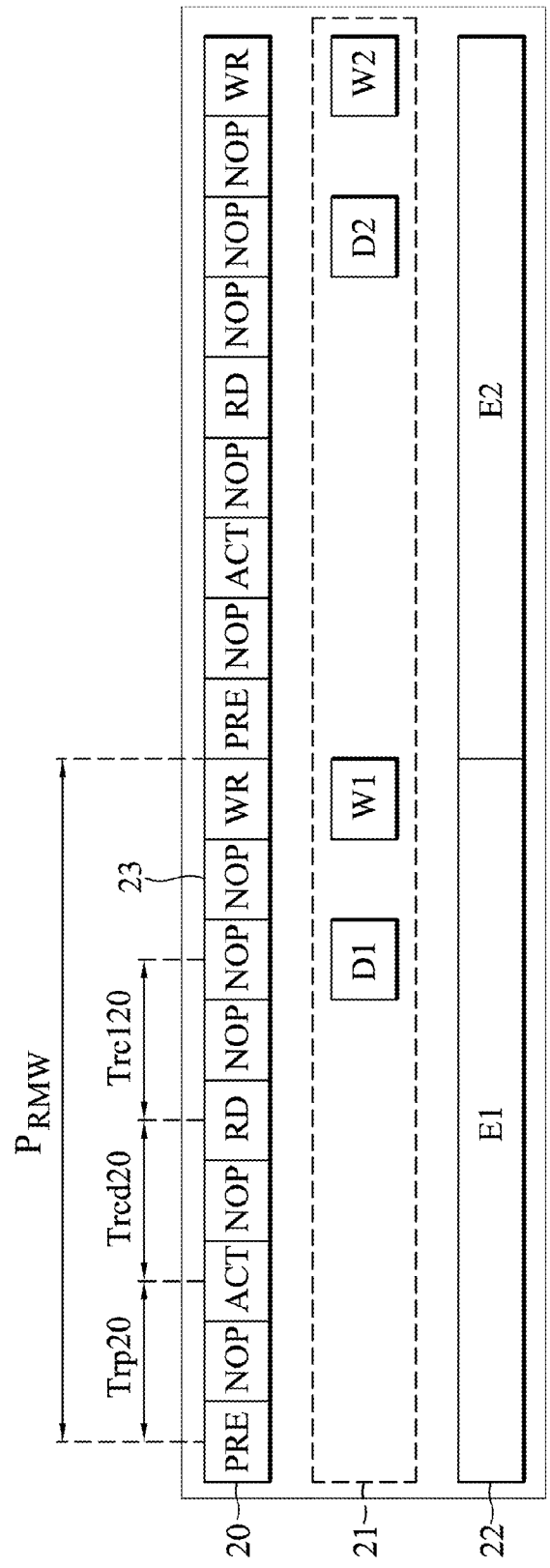
FIG. 2 depicts commands of the memory controller of FIG. 1 in RMW operations.
Figure 3:
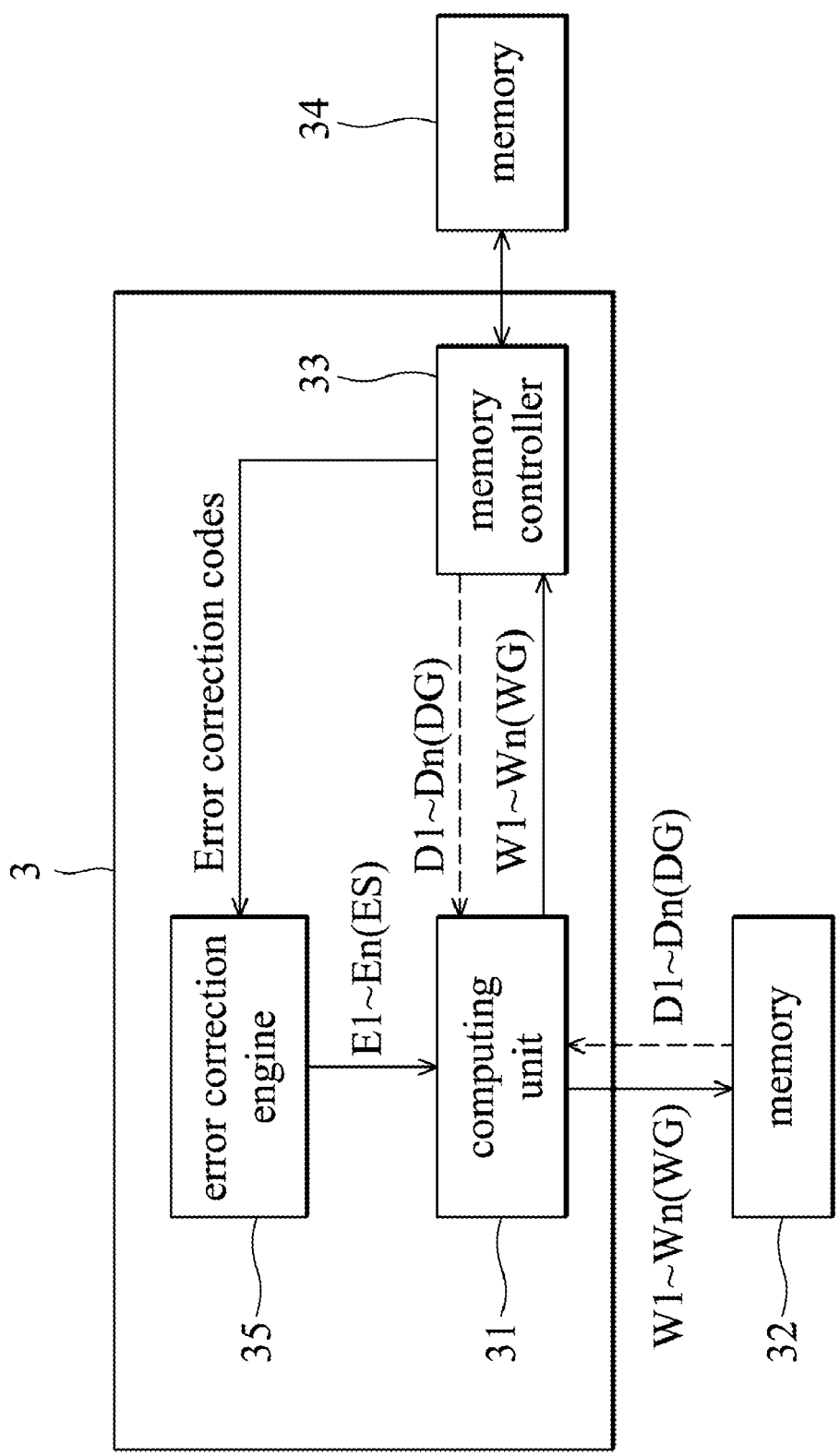
FIG. 3 depicts an embodiment of an error correction device.

Error correction devices are provided. In some embodiments, as shown in FIG. 3, an error correction device 3 comprises a computing unit 31, a memory controller 33, and an error correction engine 35. It should be noted that, in some embodiments, the error correction engine 35 could be outside of the error correction device 3 and not a portion of the error correction device 3. In some embodiments, the memory controller 33 could be outside of the error correction device 3 and not a portion of the error correction device 3. The error correction engine 35 could be Reed-Solomon (RS) engine, Chaudhuri and Hocquenghem (BCH) engine, or any other error correction engine. A memory 32 and a memory 34 can be coupled to the error correction device 3. The memory 34 stores m data sets, and the length of each data set can be one byte. The error correction engine 35 checks the m data sets. In the embodiment of FIG. 3, the error correction engine 35 determines that n data sets D1 to Dn among the m data sets are incorrect and calculates corresponding error values E1 to En, which compose an error sequence ES, according to error correction codes (ECCs). The data sets D1 to Dn are referred to a data group DG.

In FIG. 3, each of the memory 32 and the memory 34 can be a volatile memory, non-volatile memory, or any memory for memorizing data. The memory 32 and the memory 34 are independent components. Alternatively, the memory 32 and the memory 34 can be the same memory, in other words, the memory 32 and the memory 34 can be merged into a single memory.

In some embodiments, the memory 32 and the memory 34 can be included in the error correction device 3. In the error correction device 3, the memory 32 and the memory can be independent components or merged into one single memory. In an embodiment, the error correction engine 35 and the memory 32 can belong to one component, that is the error correction engine 35 and the memory 32 can be merged to form one component. In another embodiment, the computing unit 31, the memory 32, and the memory 34 can belong to one component, that is the computing unit 31, the memory 32, and the memory 34 can be merged to form one component.

Figure 4:
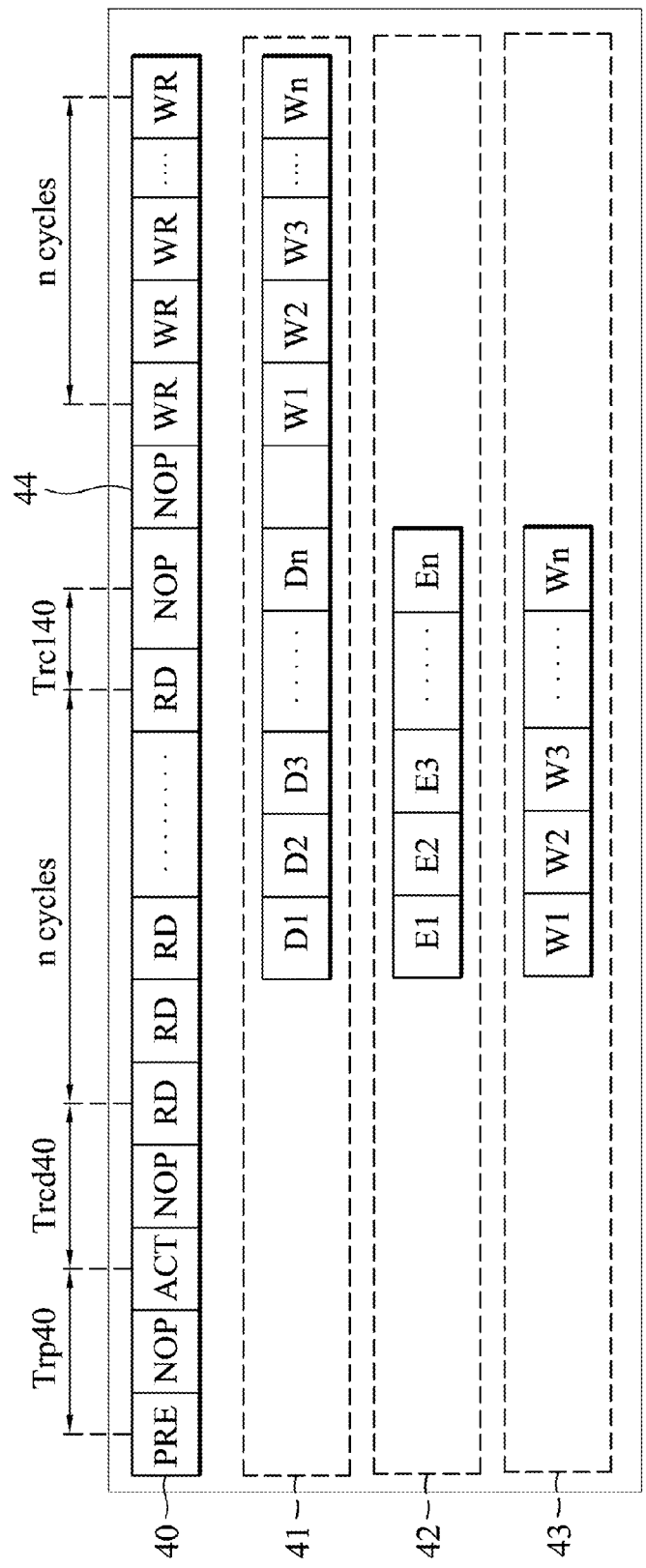
FIG. 4 depicts one example of commands of the memory controller of FIG. 3.

FIG. 4 depicts one example of commands of the memory controller 33, wherein the label "40" represents the commands of the memory controller 33, the label "41" represents reading/writing data sets on memory bus, the label "42" represents the error values E1 to En, and label "43" represents the data sets in the memory 32. Referring to FIGS. 3 and 4. After the error correction engine 35 determines that the data group DG is incorrect and calculates corresponding error sequence and location, the memory controller 33 sends a pre-charge command (PRE) and an active command (ACT) to the memory 34, so that addresses of the data group DG to be modified in the memory 34 are located. When the memory controller 33 executes a burst read operation to the memory 34, it sends read commands (RDs) to the memory 34, and the memory 34 outputs the data group DG to the computing unit through the memory bus according the addresses, represented by the dotted line between the computing unit 31 and the memory controller 33. The computing unit 31 also receives the error sequence ES from the error correction engine 35. The computing unit 31 performs a logic operation for the data group DG and the error sequence ES, thus the data group DG is modified with the error sequence ES. The modified data group WG is output from the computing unit 31 to the memory 32 for storage. When the memory controller 33 executes a write operation to the memory 34, the memory controller 33 sends write commands (WRs) to the memory 34, and the modified data group WG is output to the memory 34 from the memory 32 and restored in the corresponding addresses in the memory 34. In the case that the memory 32 and the memory 34 are merged into a single memory, the write operation can be optional.

In the following description, some operations of the above devices are described in detail. Referring to FIGS. 3 and 4, the computing unit 31 receives the error values E1 to En of the error sequence ES from the error correction engine 35. When the memory controller 33 executes a burst read operation to the memory 34 and sends n read commands (RDs) to the memory 34, the memory 34 outputs the data sets D1 to Dn of the data group DG to the computing unit 31 in order. The computing unit 31 performs a logic operation for the data sets D1 to Dn and the error values E1 to En to modify the data sets D1 to Dn and then obtains the modified data sets W1 to Wn of the modified data group WG. In this embodiment, the logic operation is an exclusive OR (XOR) operation represented by the equation $Di\ XOR\ Ei=Wi$, wherein $1 \leq i \leq n$, for example, D1 XOR E1=W1, D2 XOR E2=W2 etc. After obtaining the modified data sets W1 to Wn, the computing unit 31 outputs the modified data sets W1 to Wn to the memory 32 for storage. When the memory controller executes a write operation to the memory 34, the memory controller 33 sends n write commands (WRs) to the memory 34, and the modified data sets W1 to Wn are output to the memory 34 from the memory 32 in order and restored in the corresponding addresses in the memory 34. In this embodiment, the memory controller 33 sends one pre-charge command (PRE), one active command (ACT), n read commands, and n write commands for n data sets to be modified.

In FIG. 4, the memory controller 33 sends no-operation commands (NOPs) between the pre-charge command (PRE) and the active command (ACT), between the active command (ACT) and the first read command (RD) among the read commands (RDs), and between the last read command (RD) among the read commands (RDs) and the first write command (WR) among the write commands (RDs). The no-operation command (NOP) 44 prevents memory bus connection. The label "Trp40" represents the delay from the pre-charge command (PRE) to the active command (ACT), the label "Trcd40" represents the delay from the active command (ACT) to the first read command (RD), the label "Trcl40" represents the delay from the last read command (RD) to the time when the data set D1 on the memory bus.

Referring to FIG. 4, when n data sets are modified, the error correction device 3 requires (Trp40+Trcd40+n(RD)+Tcl40+1(NOP 44)+n(WR)) cycles. It is assumed that each of the delays Trp40, Trcd40, and Trcl40 consumes 3 cycles, and the error correction device 3 is employed in a blue-ray disc BD. When a cluster of a blue-ray disc has 248*304 bytes, and the error rate thereof is 5%. The blue-ray disc will consume about 10579 cycles ((3+3+248*5%+3+1+248*5%)*304=~10579). This is equal to about 26% of 41459 cycles consumed by the conventional error correction device 1, thus the occupied bandwidth of a memory is reduced.

In some embodiments, the determination of whether the n data sets D1 to Dn among the m data sets are incorrect by the error correction engine 35 and calculation of the error sequence ES by the error correction engine 35 is optional. The error sequence ES can be obtained in advance. Also, the execution of the write operation to the memory 34 by the memory controller 33 is optional.

Figure 5:
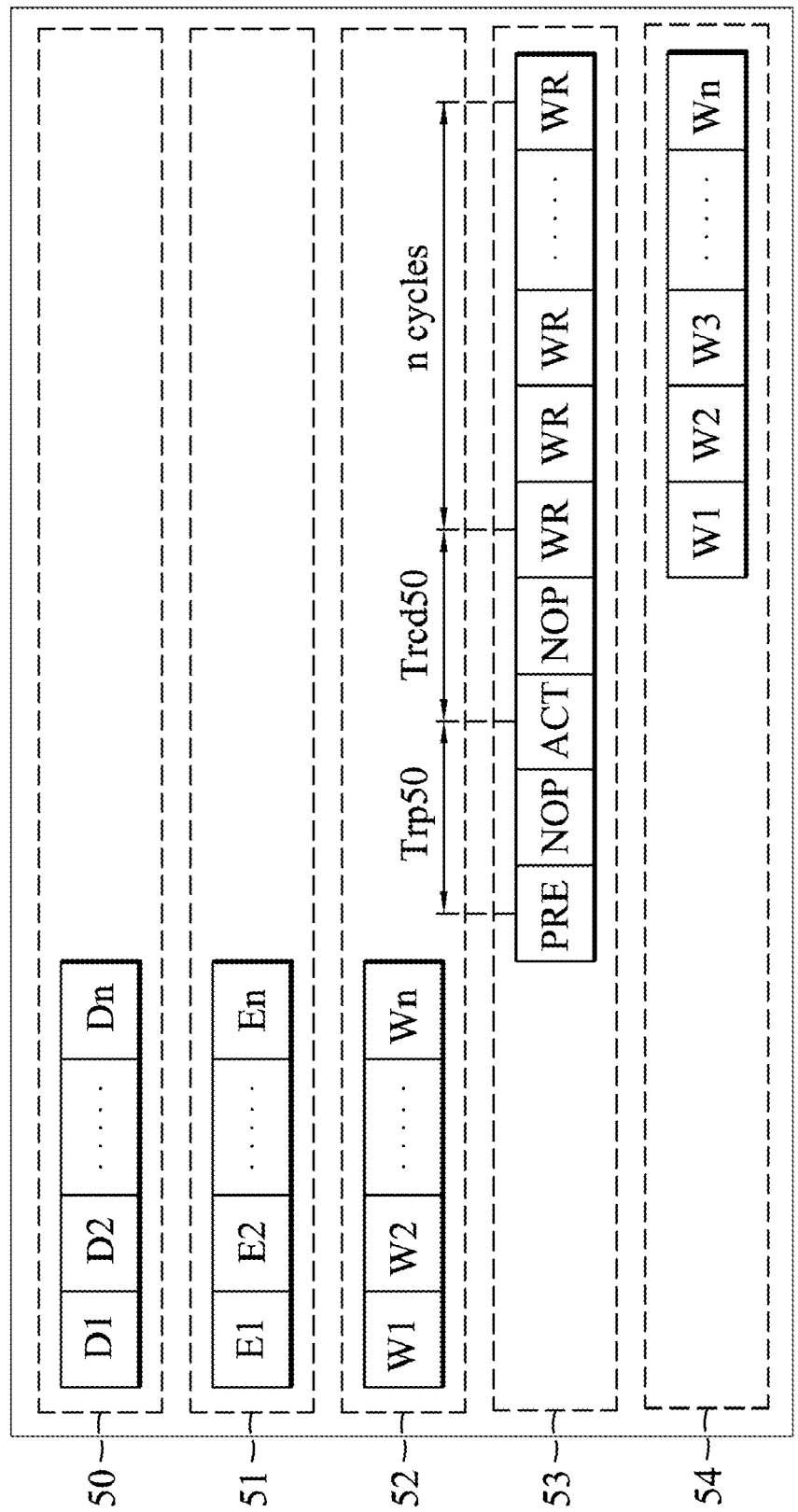
FIG. 5 depicts another example of commands of the memory controller of FIG. 3.

In some embodiments, when determining incorrect data sets D1 to Dn, the error correction engine 35 stores the data sets D1 to Dn to the memory 32. FIG. 5 depicts another example of commands of the memory controller 33, wherein the label "50" represents the data sets stored in the memory 32 in advance, the label "51" represents the error values E1 to En, the label "52" represents the data sets in the memory 32 after the correction, the label "53" represents the commands of the memory controller 33, and the label "53" represents reading/writing data sets on the memory bus.

Referring to FIGS. 3 and 5, the memory 32 stores the data sets D1 to Dn, labeled "50", in advance. The computing unit 31 receives the data sets D1 to Dn from the memory 32 (represented by the dotted line between the computing unit 31 and the memory 32) and the error values E1 to En from the error correction engine 35. The computing unit 31 then performs a logic operation for the data sets D1 to Dn and the error values E1 to En to modify the data sets D1 to Dn and obtains the modified data sets W1 to Wn. The logic operation can be an exclusive OR operation (XOR). After getting the modified data sets W1 to Wn, the computing unit 31 outputs the modified data sets W1 to Wn to the memory 32. At this time, the memory 32 stores the modified data sets W1 to Wn, instead of the data sets D1 to Dn. The memory controller 33 sends a pre-charge command (PRE) and an active command (ACT) to the memory 34, thus addresses of the data sets D1 to Dn to be modified in the memory 34 are located. When the memory controller 33 executes a burst write operation to the memory 34, it sends n write commands (WRs) to the memory 34. The modified data sets W1 to Wn are output to the memory 34 from the memory 32 in order and restored in the corresponding addresses in the memory 34. In the embodiment of FIG. 5, the memory controller 33 sends one pre-charge command (PRE), one active command (ACT), and n write commands for n data sets to be modified.

In FIG. 5, the label "Trp50" represents the delay from the pre-charge command (PRE) to the active command (ACT), and the label "Trcd50" represents the delay from the active command (ACT) to the first write command (WR). Referring FIGS. 3 and 5, when n data sets are modified, the error correction device 3 needs (Trp50+Trcd50+n(write command)) cycles. It is assumed that each of the delays Trp50 and Trcd50 consumes 3 cycles, and the error correction device 3 is employed in a blue-ray disc BD. When a cluster of a blue-ray disc has 248*304 bytes, and the error rate thereof is 5%, the blue-ray disc will consume about 5594 cycles ((3+3+248*5%)*304=~5594). It is equal to about 12% of the 41459 cycles consumed by the conventional error correction device 1. Thus, the occupied bandwidth of a memory is more reduced.

In some embodiments, the determination of whether the n data sets D1 to Dn among the m data sets are incorrect by the error correction engine 35 and calculation of the error sequence ES by the error correction engine 35 is optional. The error sequence ES can be obtained in advance with or without the determination and calculation operations of the error correction engine 35.

Figure 6:
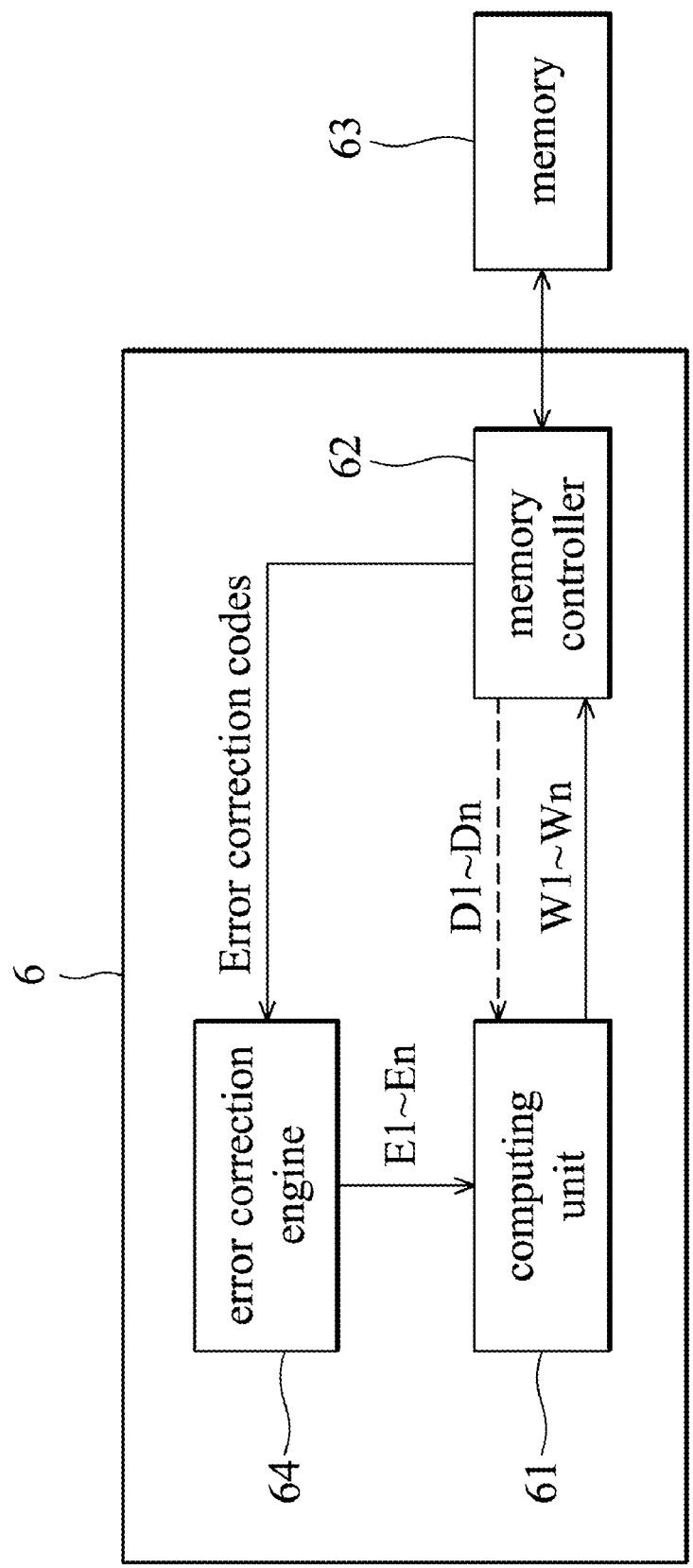
FIG. 6 depicts an embodiment of an error correction device.

In some embodiments, as shown in FIG. 6, an error correction device 6 comprises a computing unit 61, a memory controller 62, and an error correction engine 64. It should be noted that, in some embodiments, the error correction engine 64 could be outside of the error correction device 6 and not a portion of the error correction device 6. In some embodiments, the memory controller 62 could be outside of the error correction device 6 and not a portion of the error correction device 6. The error correction engine 64 could be Reed-Solomon (RS) engine, Bose, Chaudhuri and Hocquenghem (BCH) engine, or any other error correction engine. A memory 63 can be coupled to the error correction device 6. The memory 63 stores m data sets, and the length of each data set is one byte. The error correction engine 64 checks the m data sets. In the embodiment of FIG. 6, the error correction engine 64 determines that n data sets D1 to Dn among the m data sets are incorrect and calculates corresponding error values E1 to En.

In FIG. 6, the memory 63 can be a volatile memory, non-volatile memory, or any memory for memorizing data.

In some embodiments, the memory 63 can be included in the error correction device 6. In the error correction device 6, the memory 63 can be an independent component. In an embodiment, the computing unit 61 and the memory 63 can belong to one component, that is the computing unit 61 and the memory 63 can be merged to form one component. In an embodiment, the error correction engine 64 and the memory 63 can belong to one component, that is the error correction engine 64 and the memory 63 can be merged to form one component.

Figure 7A:
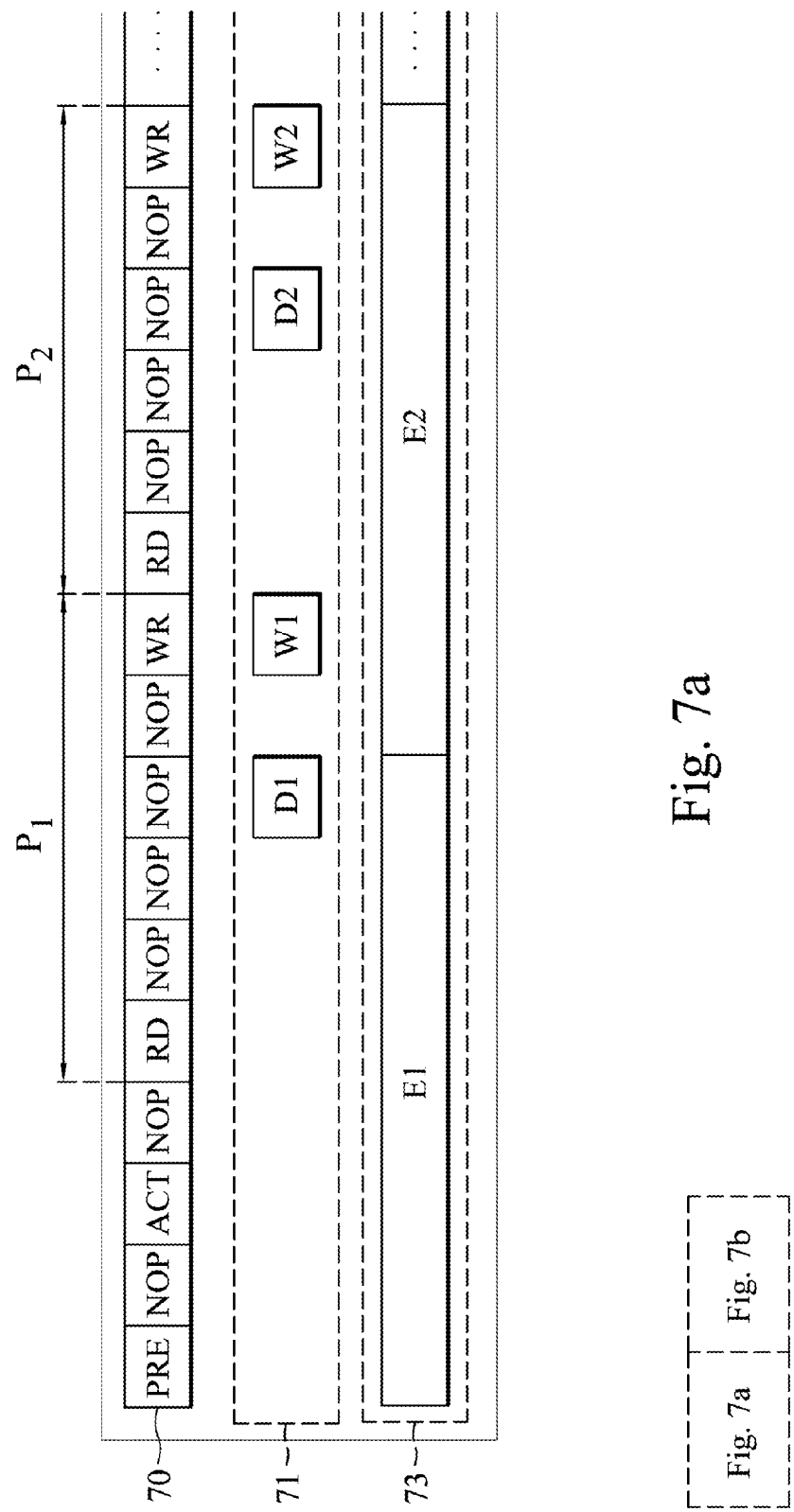
FIGS. 7a and 7b depicts another example of commands of the memory controller of FIG. 6.
Figure 7B:
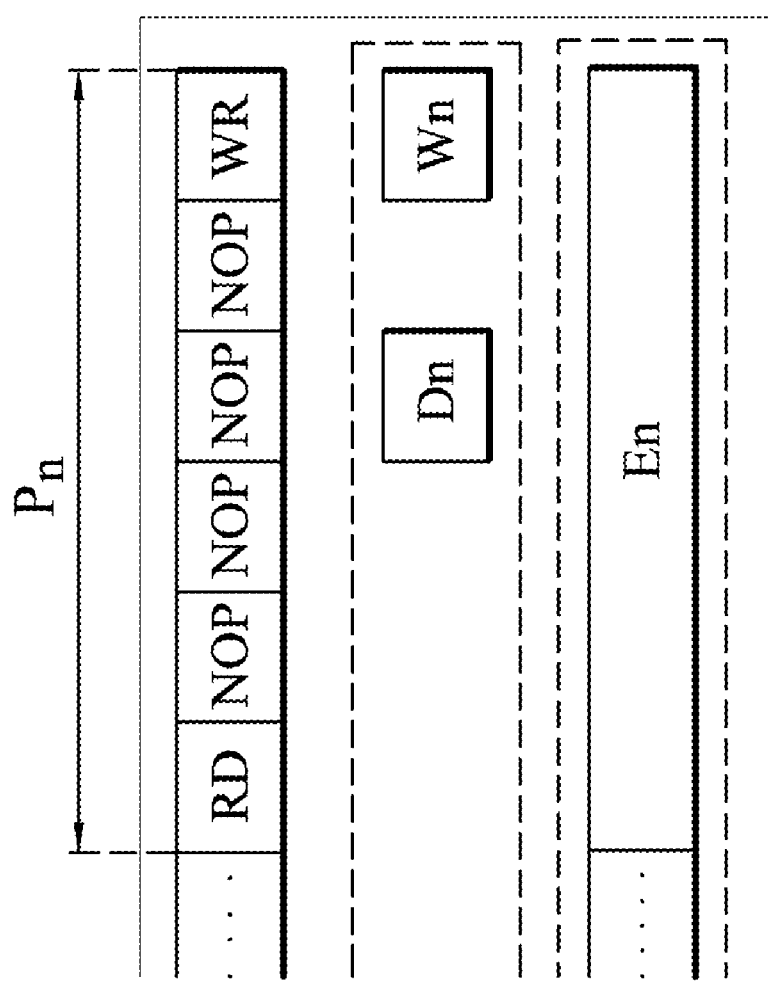

FIGS. 7a and 7b depict one example of commands of the memory controller 62, wherein the label "70" represents the commands of the memory controller 62, the label "71" represents reading/writing data on a memory bus, and the label "72" represents the error values E1 to En.

Referring to FIGS. 6, 7a and 7b, the computing unit receives the error values E1 to En from the error correction engine 64. To modify the n data sets D1 to Dn, the memory controller 62 executes a burst read-modify-write (RMW) operation to the memory 63. The memory controller 62 sends a pre-charge command (PRE) and an active command (ACT) to the memory 63, so that addresses of the data sets D1 to Dn to be modified in the memory 63 are located. The memory controller 62 then sends first read command (RD) to the memory 63. The memory 63 outputs the data set D1 to the computing unit 61, represented by the dotted line between the computing unit 61 and the memory controller 63. The computing unit 61 performs a logic operation for the data set D1 and the corresponding error value E1 to modify the data set D1 and then obtains the modified data set W1. In this embodiment, the logic operation is an exclusive OR (XOR) operation represented by the equation Di XOR Ei=Wi, wherein $1 \leq i \leq n$, for example, D1 XOR E1=W1, D2 XOR E2=W2 etc. When the memory controller 62 sends a first write command (WR) to the memory 63, the modified data set W1 is transmitted to the memory 63 from the computing unit 61 and restored in the corresponding address in the memory 63. The duration from the first read command (RD) to the first write command (WR) is referred to a first sub-RMW operation period P1.

The memory controller 62 then sends a second read command (RD) to the memory 63. The memory 63 outputs the data set D2 to the computing unit 61. The computing unit 61 performs a logic operation for the data set D2 and the corresponding error value E2 and then obtains the modified data set W2. When the memory controller 62 sends a second write command (WR) to the memory 63, the modified data set W2 is transmitted to the memory 63 from the computing unit 61 and restored in the corresponding address in the memory 63. The duration from the second read command (RD) to the second write command (WR) is referred to a second sub-RMW operation period P2. For one burst RMW operation, the above actions are repeated for modifying data sets D1 to Dn in n sub-RMW operation periods. In the i-th sub-RMW operation period Pi, the computing unit 61 receives i-th data set Di from the memory 63, performs a logic operation for the i-th data set Di and the i-th error value Ei to obtain the i-th modified data set Wi, and outputs the i-th modified data set to the memory 63 for storage. Thus, in this embodiment, the memory controller 62 only sends one pre-charge command (PRE), one active command (ACT), n read commands, and n write commands for n data sets to be modified.

In some embodiments, the determination of whether the n data sets D1 to Dn among the m data sets are incorrect by the error correction engine 64 and calculation of the error values E1 to En by the error correction engine 64 is optional. The error values can be obtained in advance with or without the determination and calculation operations of the error correction engine 64.

While the invention has been described in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An error correction device for modifying an incorrect data group among a plurality of data sets stored in a first memory, comprising:
a memory controller executing a burst read operation to the first memory to output the incorrect data group; and
a computing unit receiving an error sequence and the incorrect data group and performing a logic operation for the error sequence and the incorrect data group to obtain a modified data group,
wherein the modified data group is stored in a second memory.

2. The error correction device as claimed in claim 1, wherein the memory controller executes a write operation to control the first memory to receive and store the modified data group from the second memory.

3. The error correction device as claimed in claim 2, wherein the first memory and the second memory are the same memory.

4. The error correction device as claimed in claim 1 further comprising an error correction engine receiving a plurality of error correction codes and determining the error sequence according to the error correction codes.

5. An error correction device for modifying an incorrect data group among a plurality of data sets stored in a first memory, comprising:
a computing unit receiving an error sequence and the incorrect data group and performing a logic operation for the error sequence and the incorrect data group to obtain a modified data group; and
a memory controller executing a burst write operation to control the first memory to receive the modified data group wherein the modified data group is stored in a second memory.

6. The error correction device as claimed in claim 5, wherein the modified data group is stored in a second memory, and the memory controller executes the burst write operation to control the first memory to receive the modified data group form the second memory.

7. The error correction device as claimed in claim 6, wherein the first memory and the second memory are the same memory.

8. The error correction device as claimed in claim 5 further comprising an error correction engine receiving a plurality of error correction codes and determining the error sequence according to the error correction codes.

9. An error correction device for modifying n data sets stored in a memory, comprising:
a memory controller executing a burst read-modify-write (RMW) operation to the memory for modifying the n data sets in n predetermined periods; and
a computing unit;
wherein when the memory controller executes the burst RMW operation to the memory, in the i-th predetermined period among the n predetermined periods, the computing unit receives the i-th data set, performs a logic operation for the i-th data set and an i-th error value to obtain the i-th modified data set, and outputs the i-th modified data set to the memory, $1 \leq i \leq n$ wherein the n modified data sets are stored in a second memory.

10. The error correction device as claimed in claim 9 further comprising an error correction engine receiving a plurality of error correction codes and determining n error values according to the error correction codes, wherein the n error values comprises the i-th error value.

11. The error correction device as claimed in claim 9, wherein the memory controller only sends one pre-charge command, one active command, n read commands and n write commands for the n data sets.

12. A method for modifying an incorrect data group among a plurality of data sets stored in a first memory, comprising:

executing a burst read operation to the first memory to control the first memory to output the incorrect data group;

performing a logic operation for an error sequence and the incorrect data group to obtain a modified data group; and storing the modified data group in a second memory.

13. The method as claimed in claim 12 further comprising executing a write operation to control the first memory to receive and store the modified data group from the second memory.

14. The method as claimed in claim 13, wherein the first memory and the second memory are the same memory.

15. The method as claimed in claim 12 further comprising:
receiving a plurality of error correction codes; and
determining the error sequence according to the error correction codes.

16. A method for modifying an incorrect data group among a plurality of data sets stored in a first memory, comprising:
performing a logic operation for an error sequence and the incorrect data group to obtain a modified data group; and
executing a burst write operation to control the first memory to store the modified data group wherein the modified data group is stored in a second memory.

17. The method as claimed in claim 16 further comprising storing the modified data group in a second memory, wherein the step of executing the burst write operation comprises executing the burst write operation to control the first memory to receive the modified data group from the second memory.

18. The method as claimed in claim 17, wherein the first memory and the second memory are the same memory.

19. The method as claimed in claim 16 further comprising:
receiving a plurality of error correction codes; and
determining the error sequence according to the error correction codes.

20. A method for modifying n data sets stored in a memory, comprising:
executing a burst read-modify-write (RMW) operation to the memory to output the n data sets in n predetermined periods; and
performing a logic operation for the i-th data set and an i-th error value to obtain the i-th modified data set and storing the i-th modified data set to the memory in the i-th predetermined period among the n predetermined periods, wherein $1 \leq i \leq n$ wherein the n modified data sets are stored in a second memory.

21. The method as claimed in claim 20 further comprising:
receiving a plurality of error correction codes; and
determining n error values according to the error correction codes;
wherein the n error values comprises the i-th error value.

* * * * *